US006923062B2

(12) United States Patent
Franz et al.

(10) Patent No.: US 6,923,062 B2
(45) Date of Patent: Aug. 2, 2005

(54) SENSOR

(75) Inventors: Jochen Franz, Reutlingen (DE); Oliver Kohn, Reutlingen (DE); Frank Henning, Reutlingen (DE); Matthias Maute, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/474,287

(22) PCT Filed: Feb. 20, 2002

(86) PCT No.: PCT/DE02/00621
§ 371 (c)(1),
(2), (4) Date: Mar. 1, 2004

(87) PCT Pub. No.: WO02/082096
PCT Pub. Date: Oct. 17, 2002

(65) Prior Publication Data
US 2004/0129077 A1 Jul. 8, 2004

(30) Foreign Application Priority Data
Apr. 5, 2001 (DE) ........................ 101 16 931

(51) Int. Cl.$^7$ ............................................. G01P 15/02
(52) U.S. Cl. ............................. 73/514.38; 73/514.01; 73/514.14; 73/514.23; 73/514.24; 73/514.32; 73/862.382
(58) Field of Search ............................. 73/493, 514.01, 73/514.12, 514.29, 514.32, 514.33, 514.36, 514.37, 514.38, 862.382, 514.14, 514.23

(56) References Cited
U.S. PATENT DOCUMENTS 6,005,275 A  12/1999  Shinogi et al.
6,272,926 B1 *  8/2001  Fehrenbach et al. ...... 73/514.32
6,360,605 B1 *  3/2002  Pinter et al. .............. 73/514.38
6,389,899 B1 *  5/2002  Partridge et al. ......... 73/514.33

FOREIGN PATENT DOCUMENTS

| DE | 195 31 058 | 3/1996 |
| DE | 198 17 357 | 10/1999 |
| DE | 198 25 298 | 12/1999 |
| DE | 199 30 779 | 1/2001 |
| JP | 2000 338 126 | 12/2000 |
| WO | 01 98786 | 12/2001 |

* cited by examiner

Primary Examiner—Hezron Williams
Assistant Examiner—John Hanley
(74) Attorney, Agent, or Firm—Kenyon & Kenyon

(57) ABSTRACT

For a sensor whose sensor structure is implemented in a micromechanical structural component and which has parts which are movable in relation to the stationary substrate of the structural component, and which also includes an unsupported a seismic mass, a spring system having at least one spring, the seismic mass being connected to the substrate through the spring system, and an overload protection to limit the deflection of the spring system and the seismic mass in at least one direction, and an arrangement for detecting the deflections of the spring system and the seismic mass, whereby the impact forces may be reduced to prevent conchoidal breaks and resulting incipient damage to the sensor structure, as well as formation of particles. To that end, at least one two-dimensional stop for at least one moving part of the sensor structure is provided as overload protection. Alternatively or in addition thereto, at least one spring or resilient stop for at least one moving part of the sensor structure is provided as overload protection.

15 Claims, 4 Drawing Sheets

SENSOR

FIELD OF THE INVENTION

The present invention relates to a sensor whose sensor structure is implemented in a micromechanical structural component and has parts that are movable in relation to the stationary substrate of the structural component. The sensor structure includes at least one unsupported seismic mass and a spring system having at least one spring, the seismic mass being connected with the substrate through the spring system. The sensor structure also includes an overload protection device to limit the deflection of the spring system and the seismic mass in at least one direction. The sensor is also equipped with an arrangement means for detecting the deflections of the spring system and the seismic mass.

BACKGROUND INFORMATION

The seismic mass of that sensor is constructed in the form of a rocker which is both mechanically and electrically connected to the stationary substrate of the structural component. While the distribution of mass of the rocker is asymmetrical in relation to the torsion spring system, the rocker has two capacitor surfaces which are arranged and constructed symmetrically in relation to this spring system, and each of which forms a capacitor together with the substrate. An acceleration acting on the sensor structure causes the rocker to rotate or tilt around the spring system, thus causing a change in the difference of capacitances between these two capacitors. By evaluating the difference of capacitances or its change, it is possible to determine the acceleration acting on the sensor structure. The known acceleration sensor has a vertical sensitivity, so that accelerations perpendicular to the plane of the chip are detectable with the known sensor.

The moving parts of the sensor structure of the known sensor may only be deflected within certain limits without mechanical damage such as a broken spring or electrical short circuits occurring. Overload accelerations may also result in greater deflections of the moving parts, however, and thus to corresponding damage. For that reason, the known acceleration sensor is equipped with stops for the torsion springs. These stops are located in the area of connection between the torsion spring and the rocker and are rigidly connected to the substrate of the structural component, so that the deflection of the torsion springs and the motion of the rocker in the x/y plane, i.e. parallel to the plane of the chip, is limited. The geometry of the stops is not adapted to the expected deformation and deflection of the torsion springs, so that the stops and the torsion springs make contact only at points or edges in the event of a corresponding overload acceleration.

In regard to acceleration in the z direction two cases must be distinguished: acceleration into the substrate and acceleration out of the substrate. In the first of these cases the motion of the torsion spring and of the seismic mass is easily limited by a stop at an electrically neutral location on the substrate. In contrast, a motion of the seismic mass out of the substrate, as is to be expected in the second case, is not easily limited. Hence in the case of a structural height of around 10 $\mu$m, deflections of 10 $\mu$m or more may result in the seismic mass being elevated out of its surroundings, and consequently in the sensor structure getting stuck.

In non-directed drop tests of the known acceleration sensor, conchoidal breaks were found on the outer edge of the stops and on the torsion spring. Such conchoidal breaks may modify the mechanical properties of the spring system or result in development of cracks as incipient damage to the sensor structure. This may cause changes to the characteristics of the sensor such as sensitivity, offset and test signal. Furthermore, conchoidal breaks are a source of particles that may cause electrical short circuits or also mechanical blocking of the rocker. On the whole, the aforementioned conchoidal breaks usually result in quality-relevant degradation of the sensor function, and in extreme cases may even result in total failure of the sensor function.

SUMMARY OF THE INVENTION

The exemplary embodiments(s) of the present invention provide two ways to allow the impact forces in a sensor of the type named at the beginning to be reduced, in order to prevent conchoidal breaks and related incipient damage to the sensor structure as well as particle formation.

This is achieved according to the exemplary embodiment of the present invention in part by the fact that a stop for a moving part of the sensor structure, which functions as an overload protection device, is of a flat design, so that in the event of a corresponding overload acceleration contact between the moving part and this stop occurs via a flat surface. This enables the impact forces to be distributed to the sensor structure and absorbed by it more uniformly.

In addition, it is proposed according to the exemplary embodiments of the present invention that a stop for a moving part of the sensor structure, which functions as a means of to provide overload protection, be of an elastic design. In this case the impact forces are reduced by having the kinetic energy converted at least partially into flexural energy. The conversion of the kinetic energy into flexural energy may be influenced by the design of the spring (springy) or resilient stop.

It should be pointed out here that the two measures explained above for reducing the impact forces may be implemented independently of each other or may also be combined. The exemplary embodiment of the present invention therefore includes both sensor structures having two-dimensional stops and sensor structures having spring or resilient stops, and also sensor structures that include both two-dimensional stops and spring or resilient stops, as well as sensor structures with stops that are both two-dimensional and of elastic design.

In principle, there are various possibilities for implementing and arranging a two-dimensional stop in the sensor structure of a sensor according to the present invention.

In an advantageous variant, the two-dimensional stop is positioned so that it forms a stop surface for at least one spring system; that is, it limits the deflection of that spring. In addition, the two-dimensional stop may be inclined or curved in the direction of the deflection of the spring. It is particularly advantageous if the geometry of the two-dimensional stop is adapted to has approximately the shape of the bending line of the spring. This shape of the stop guarantees a surface contact between the spring and the stop in every case.

In principle, there are also a variety of possibilities for the design and arrangement of a spring or resilient stop in the sensor structure of the sensor according to the present invention.

In view of easy implementation in the sensor structure, it is advantageous if the spring or resilient stop includes at least one cantilever spring which is connected to the substrate at one end. The length and width of the cantilever spring are available here as free design parameters by which the conversion of the kinetic energy into flexural energy may be influenced. A particularly smooth, gradual deceleration of the moving parts of the sensor structure is attainable in an advantageous way with the help of a multi-stage spring or resilient stop that includes a plurality of cantilever springs arranged essentially parallel to each other. The cantilever springs of such a multi-stage spring or resilient stop may vary in length and/or width, depending on what springing effect is to be achieved. The elastic effect also depends here on the intervals between the individual cantilever springs— that is, on how far one cantilever spring of the multi-stage stop may be deflected without touching the adjacent cantilever springs of the stop. Independent of the length and width of the individual cantilever springs, this spacing is predefinable in an advantageous way, using nubs which are advantageously formed on the individual cantilever springs in the area of the free ends.

In an advantageous variant of the sensor according to the present invention, at least one spring or resilient stop is provided for at least one spring of the spring system. In this connection, it is advantageous if the at least one cantilever spring of the spring or resilent stop is positioned essentially parallel to the spring, so that the end of the spring connected to the seismic mass and the free end of the cantilever spring point in the same direction. With such an arrangement of spring and cantilever spring, the cantilever spring is able to follow the motion of the spring and thus to decelerate the motion of the spring in a particularly smooth manner.

In addition or alternatively, at least one spring or resilient stop may be provided for the seismic mass. In a first variant of the sensor, the spring or resilient stop might simply be positioned essentially parallel to one side of the seismic mass. However, it is advantageous for reasons of space if the seismic mass has at least one cutout, and the at least one cantilever spring of the spring or resilient stop is positioned essentially parallel to at least one side wall of this cutout. A particularly good deceleration effect is achievable if the cutout is in the edge area of the seismic mass, and the at least one cantilever spring of the spring or resilient stop is positioned so that at least its free end projects into the cutout.

Two-dimensional and spring or resilient stops like those explained above may be integrated in an advantageous manner into the micromechanical sensor structure of a sensor according to the present invention if these stops are intended to limit the deflection of the spring system and of the seismic mass only in the x/y direction—that is, deflections in a plane oriented parallel to a direction lying in the main plane of the structural component, that is, the plane parallel to the surface of the semiconductor wafer. Chipping and associated formation of particles may additionally be prevented in this case by having at least part of the corner regions in the sensor structure provided with roundings or rounded off.

DETAILED DESCRIPTION

Each of the sensor structures depicted in FIGS. 1 through 5 is implemented in a micromechanical structural component, and includes parts that are movable in relation to the stationary substrate of the structural component, namely a seismic mass 1 and a spring system having at least one spring 2. In all drawings, the orientation of the X and Y axes is shown, while the Z axis is assumed to be oriented perpendicular to the page. Seismic mass 1 is connected to the substrate through a spring system, so that the distribution of mass of seismic mass 1 is asymmetrical in reference to the spring system. All of the sensor structures depicted in FIGS. 1 through 5 are designed for use in an acceleration sensor having horizontal and vertical sensitivity, in that the seismic mass 1 is designed in the form of a rocker and the spring system includes at least one torsion spring 2. Accelerations acting on the sensor structure are detected and determined in this case through the corresponding deflections of the spring system and of the seismic mass.

In addition, in each of the sensor structures depicted in FIGS. 1 through 5, an arrangement for overload protection is provided to limit the deflection of the spring system and the seismic mass in at least one direction.

Figure 1:
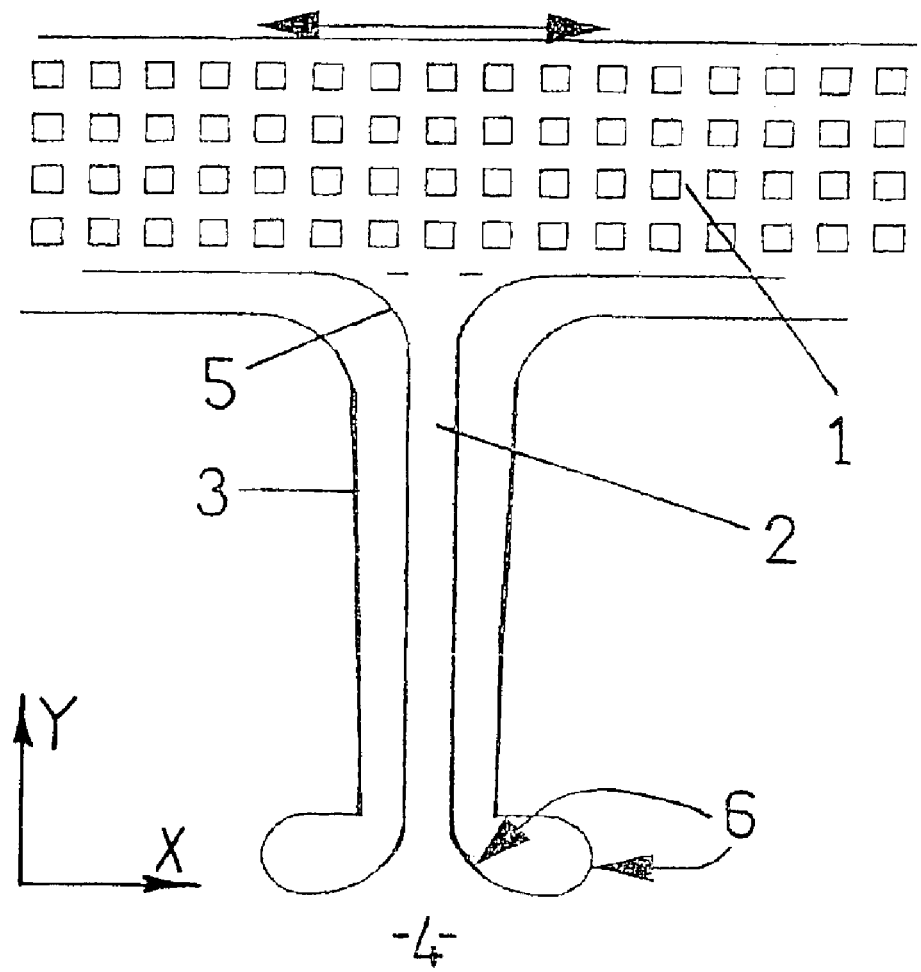
FIG. 1 shows a detail of a top view of a sensor structure with a two-dimensional stop of a first sensor according to the present invention.

The sensor structure depicted in FIG. 1 has a two-dimensional stop 3 as overload protection for torsion spring 2. This two-dimensional stop 3 is implemented in the form of a solid structure placed on the substrate and limits the deflection of torsion spring 2 in an x/y direction that is, in a plane that is oriented parallel to a direction lying in the main plane of the structural component. To prevent edge contact of torsion spring 2 and ensure surface contact, stop 3 is constructed as a slope whose inclination is derived from the bending line of torsion spring 2. Alternatively, the two-dimensional stop could also have a curvature, for example the curvature of a hyperbola.

Torsion spring 2 of the sensor structure depicted in FIG. 1 has a rounding 5, 6, both in the region of transition to seismic mass 1 and in the region of transition to "mainland" 4, i.e. to the region in which torsion spring 2 is connected to the substrate of the structural component. The function of these roundings is to reduce the tension in vertical deflections of torsion spring 2, i.e. in deflections perpendicular to the main plane of the structural component. That makes it possible to reduce the probability of a break in drop tests.

In connection with FIG. 1 it should also be noted that within the scope of the invention a two-dimensional stop may also be provided as overload protection for other moving parts of the sensor structure, namely for the seismic mass for example. The various possibilities for designing such a stop in the sensor structure are explained in greater detail in conjunction with FIGS. 3 and 5.

Figure 2:
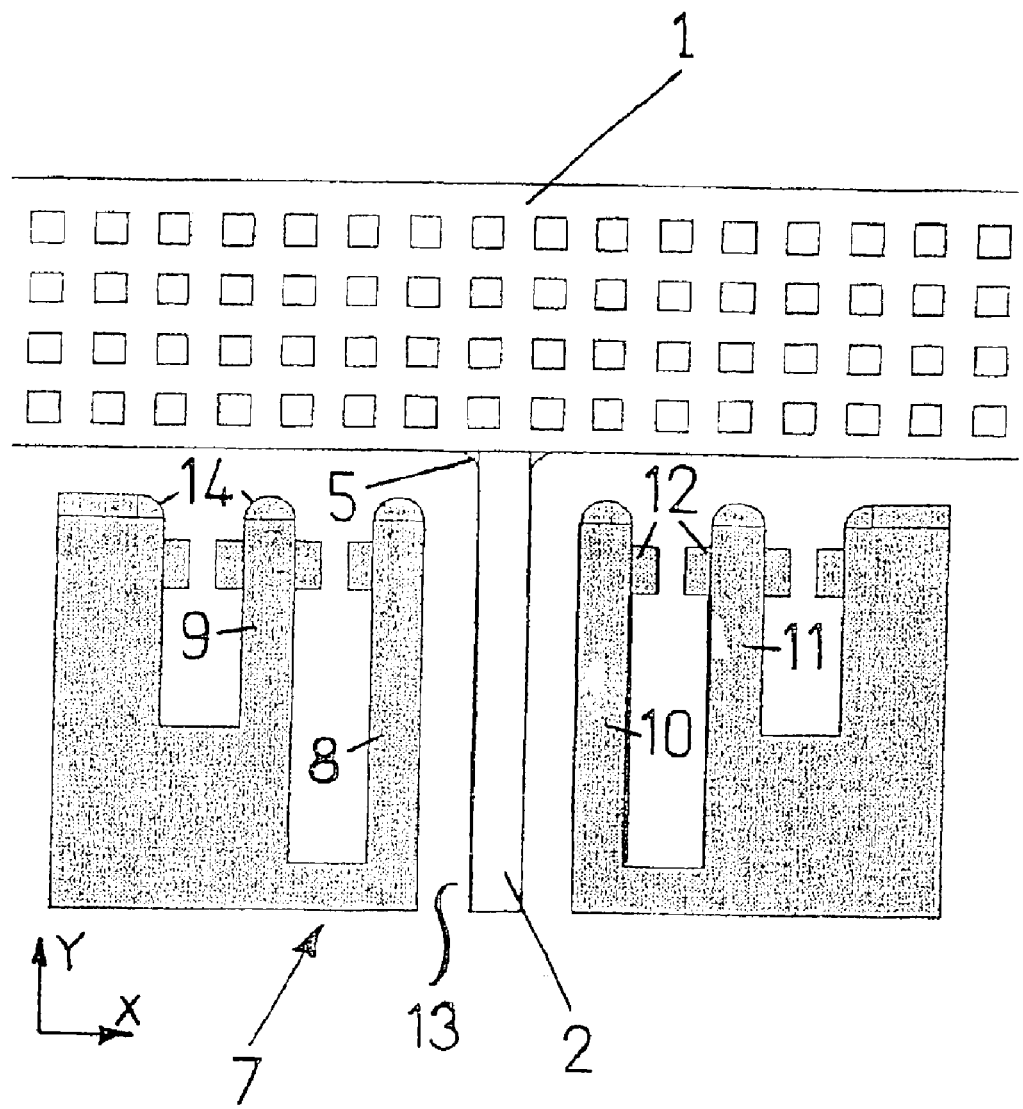
FIG. 2 shows a detail of a top view of a sensor structure with a spring or resilient stop of a different sensor according to the present invention.

FIG. 2 depicts a multi-stage spring or resilient stop 7 for torsion spring 2, which limits the deflection of torsion spring 2 in an x/y direction just as the two-dimensional stop shown in FIG. 1 does. To that end, the spring or resilient stop includes a total of four cantilever springs 8, 9 and 10, 11, which are positioned on both sides of torsion spring 2 essentially parallel to it. Cantilever springs 8, 9 and 10, 11 are all connected at one end to the substrate of the structural component, so that their free ends and the end of torsion spring that is connected to seismic mass 1 all point in the same direction. The individual cantilever springs 8, 9 and 10, 11 of the spring or resilient stop depicted here differ in length. Inner cantilever springs 8 and 10, immediately adjacent to torsion spring 2, are significantly longer than the two outer cantilever springs 9 and 11. The deflection of the individual cantilever springs 8, 9 and 10, 11 is limited by nubs 12 which are formed in the region of the free ends of cantilever springs 8, 9 and 10, 11. In addition, the free ends of cantilever springs 8, 9 and 10, 11 are provided with roundings 14, to prevent chipping in this area.

Central channel 13 between the two inner cantilever springs 8 and 10 forms a guide for torsion spring 2 during vertical accelerations that cause seismic mass 1 to be elevated out of the substrate level. In these cases central channel 13 prevents seismic mass 1 from getting caught as it returns to its starting position. Therefore there should be no nubs protruding into central channel 13. In addition, cantilever springs 8, 9 and 10, 11 should have no less than a critical bending strength, in order to prevent torsion spring 2 from adhering on cantilever springs 8 and 10. The critical bending strength is usually determined by experiment, with experience with comparable similar sensor structures able to provide a starting point.

In a particularly advantageous variant of the sensor structure depicted in FIG. 2, the sides of cantilever springs 8 and 10 facing torsion spring 2 are beveled, so that the contact against the spring or resilient stop also is not on an edge but flat.

Figure 3:
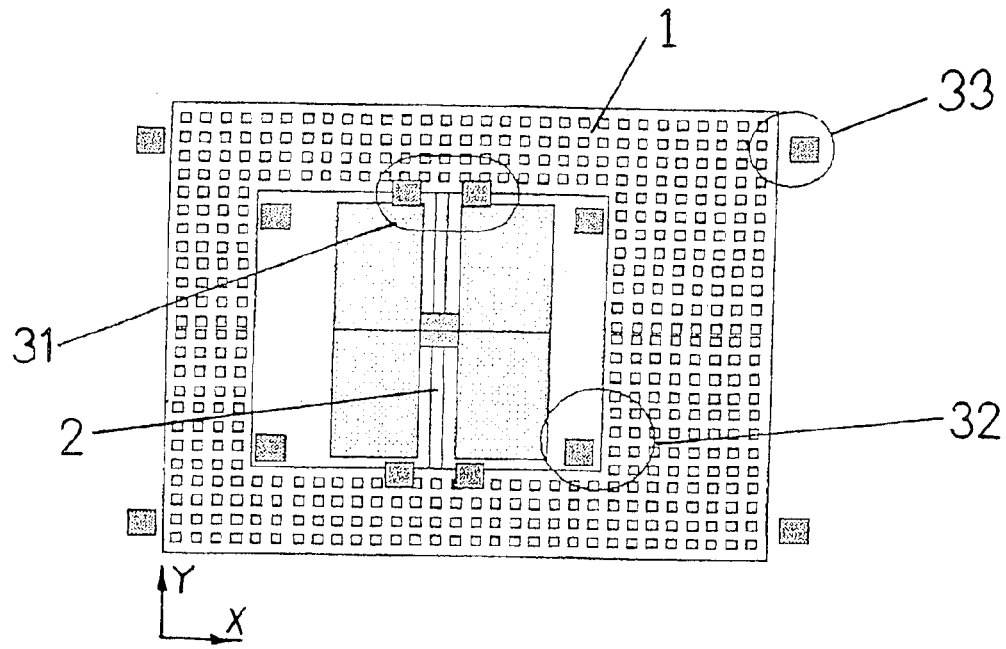
FIG. 3 shows various stop positions on the seismic mass of a sensor according to the present invention.

In the sensor structure of a sensor according to the present invention, in addition to or alternatively to the stops described above which are used as an overload protection, there may also be two-dimensional or spring or resilient stops provided for the seismic mass. FIG. 3 shows various possibilities for positioning such stops. There are essentially three conceivable areas: the area directly on torsion spring 2—stops 31; an area on the inner edge of seismic mass 1—stops 32; and the outer area of seismic mass 1—stops 33.

Stops 33 located in the outer edge area of seismic mass 1 have the advantage that during rotational accelerations the motion of seismic mass 1 ends in the stop even in the case of slight deflections. The pulse transfer is correspondingly slight.

As mentioned earlier, acceleration perpendicular to the main plane of the structural component may result in the seismic mass being elevated out of the sensor structure and consequently the sensor structure becoming caught, if the motion of the seismic mass in this z direction is not limited. If no corresponding z stop is present, it is advantageous to position the stops as close as possible to the axis of rotation of the seismic mass, since the elevation of the seismic mass is minimal at this location in the sensor structure.

Figure 4:
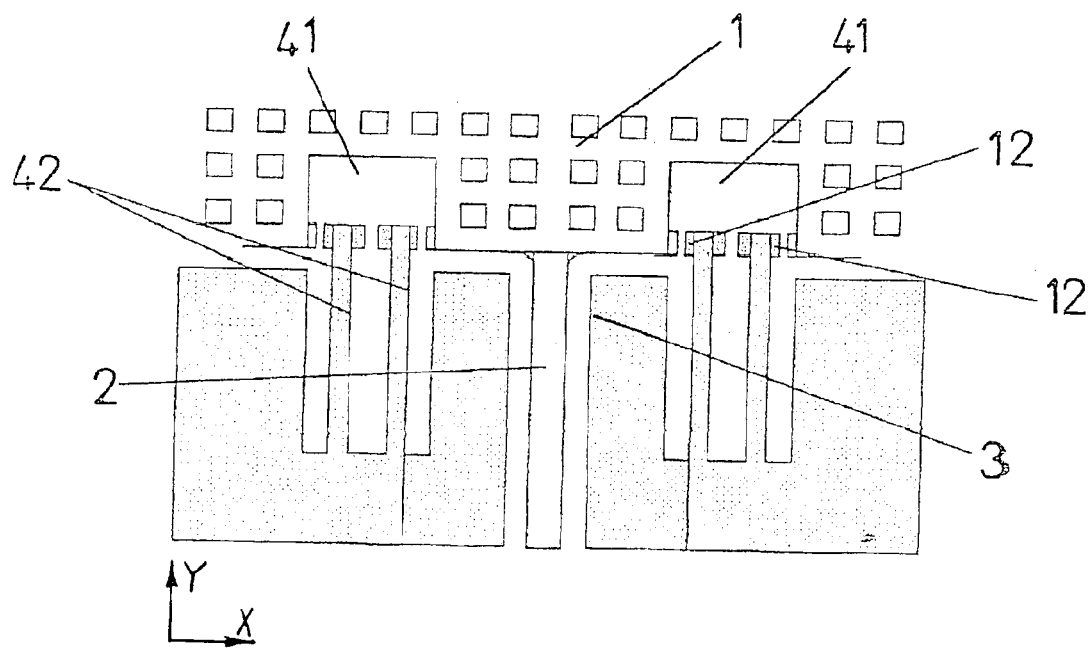
FIG. 4 shows a detail of a top view of a sensor structure with a spring or resilient stop of a different sensor according to the present invention.

FIG. 4 depicts a possibility of implementing a spring or resilient stop on seismic mass 1. The seismic mass here has two cutouts 41 in the edge area. The free ends of two cantilever springs 42, which are positioned essentially parallel to the side walls of the two cutouts 41, project into these two cutouts 41. The free ends of cantilever springs 42 and cutouts 41 all have nubs, so that the resulting stop intervals between cantilever springs 42 within a cutout 41 and the side walls of the corresponding cutout 41 differ. That results in stepwise stopping. In addition, the bending strength of cantilever springs 42, which is influenced by the respective lengths and widths of cantilever springs 42, is chosen so that the resulting restoring forces are sufficient to prevent cantilever springs 42 from adhering on seismic mass 1.

Finally, it should also be pointed out that the spring or resilient stop described above may also be designed as a two-dimensional stop for the seismic mass, and may be combined with the roundings of torsion spring 2 described in conjunction with FIG. 1.

Figure 5:
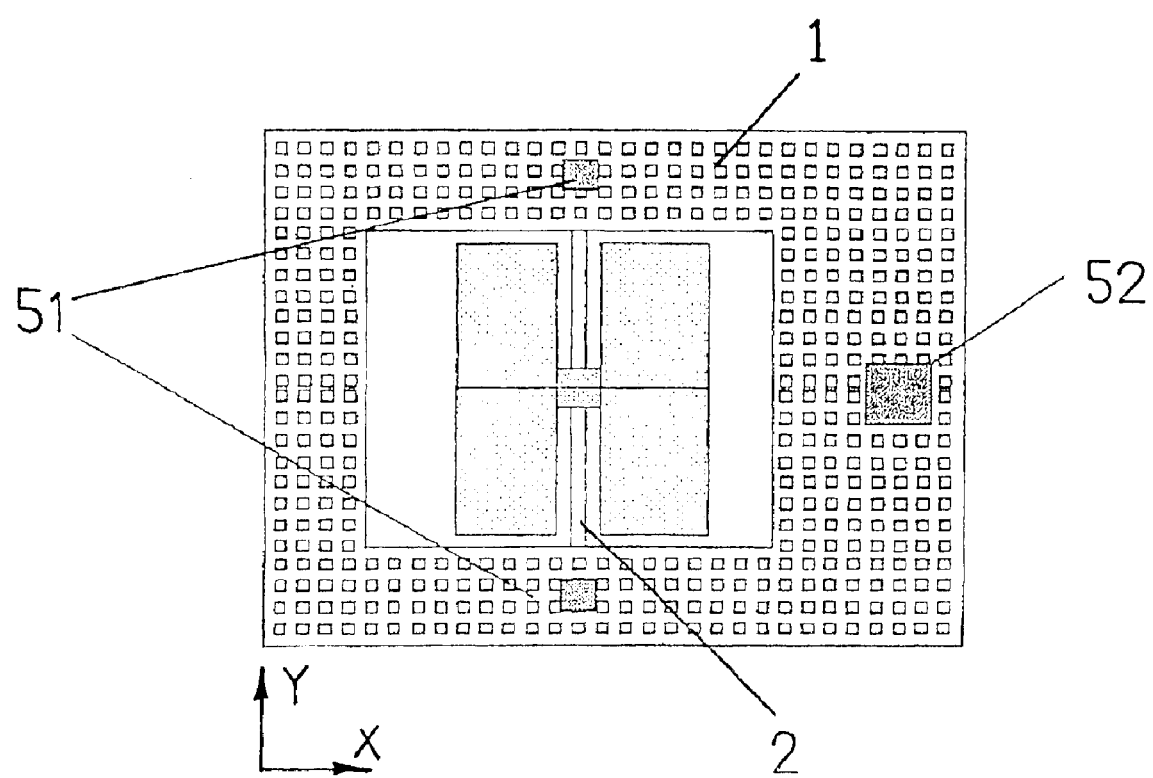
FIG. 5 shows additional possible stop positions on the seismic mass of a sensor according to the present invention.

In principle, it is also possible to position stops 51, 52 within seismic mass 1, as illustrated in FIG. 5. Stops 51 are located at extensions of torsion spring 2 within the suspension mounts of the capacitor surfaces, through which the deflections of the seismic mass are determined here. This arrangement of stops 51 permits simple electrical contacting.

When positioning stops in a sensor structure, such as those that are part of a sensor according to the present invention, the following aspects must be kept in mind:

Stops which limit the motion of at least one spring of the spring system in the x/y direction also act as guides for the spring if the seismic mass is elevated out of the x/y plane by vertical acceleration, so that the seismic mass may slide back into its starting position again. In this variant, overload accelerations in the z direction do not necessarily result in a failure of the sensor function. In the event of incipient damage, these stops may significantly influence the properties of the sensor, such as sensitivity, test signal, and offset, since the springs are a mechanically very sensitive structure.

In contrast, stops which limit the motion of the seismic mass in the an x/y direction do not affect the mechanical properties and the functionality of the spring system. However, these stops also do not function as guides in deflections of the seismic mass in the z direction, so that it is easier here for the seismic mass to get stuck and remain on the sensor structure, which results in a failure of the sensor function. In addition, incipient damage of the sensor structure by particle formation is not detectable in this case, because the sensor properties or the characteristic parameters do not change. Faults in the sensor function caused by wandering particles are also not detectable.

What is claimed is:

1. A sensor, comprising:
   a sensor structure implemented in a micromechanical structural component and including parts, at least one of the parts being movable in relation to a stationary substrate of the micromechanical structural component, the parts including:
   a seismic mass;
   a spring system including at least one first spring, the seismic mass being connected to the stationary substrate through the spring system; and
   an overload protection element to limit a deflection of the spring system and a deflection of the seismic mass in at least one direction;
   wherein the overload protection element includes at least one resilient stop, and the at least one resilient stop is configured to contact the at least one first spring.

2. The sensor as recited in claim 1, wherein the at least one resilient stop includes at least one cantilever connected to the stationary substrate on one end of the cantilever.

3. The sensor as recited in claim 2, wherein the at least one resilient stop includes a plurality of cantilevers, each cantilever connected to the stationary substrate on one end of the cantilever, the cantilevers being positioned substantially parallel to each other, the cantilevers forming a multi-stage stop.

4. The sensor as recited in claim 3, wherein the cantilevers differ in at least one of length and width.

5. The sensor as recited in claim 2, further comprising:
   at least one nub formed on at least one of the cantilevers, wherein at least one area of a surface of the at least one nub forms a stop face of the at least one of the cantilevers.

6. The sensor as recited in claim 5, wherein the at least one nub is formed in an area of a free end of the at least one of the cantilevers.

7. The sensor as recited in claim 2, wherein the cantilevers are positioned substantially parallel to the at least one first spring so that an end of the at least one first spring connected to the seismic mass and a free end of the cantilevers point in the same direction.

8. The sensor as recited in claim 2, wherein the seismic mass includes at least one cutout, and the cantilevers are positioned substantially parallel to at least one side wall of the at least one cutout.

9. The sensor recited in claim 8, wherein the at least one cutout is located in an edge area of the seismic mass, and the cantilevers are positioned so that at least a free end thereof projects into the at least one cutout.

10. The sensor as recited in claim 1, wherein the at least one resilient stop is configured to contact the seismic mass.

11. The sensor as recited in claim 1, wherein the at least one resilient stop limits the deflection of the spring system and the deflection of the seismic mass in a direction lying in a main plane of the micromechanical structural component.

12. The sensor as recited in claim 11, wherein at least one part of corner areas in the sensor structure is provided with roundings.

13. A sensor, comprising:
a sensor structure implemented in a micromechanical structural component and including parts, at least one of the parts being movable in relation to a stationary substrate of the micromechanical structural component, the parts including:
a seismic mass;
a spring system including at least one spring, the seismic mass being connected to the stationary substrate through the spring system; and
an overload protection element to limit a deflection of the spring system and a deflection of the seismic mass in at least one direction;
wherein the overload protection element includes at least one two-dimensional stop;
and wherein the at least one two-dimensional stop is configured to contact the at least one spring.

14. The sensor as recited in claim 13, wherein the at least one two-dimensional stop is one of inclined and curved in a direction of a deflection of the at least one spring.

15. The sensor as recited in claim 13, wherein a geometry of the at least one two-dimensional stop has approximately the shape of a bending line of the at least one spring.

* * * * *

UNITED STATES PATENT AND TRADEMARK OFFICE
CERTIFICATE OF CORRECTION

PATENT NO. : 6,923,062 B2 Page 1 of 1
APPLICATION NO. : 10/474287
DATED : August 2, 2005
INVENTOR(S) : Franz et al.

It is certified that error appears in the above-identified patent and that said Letters Patent is hereby corrected as shown below:

On the TITLE PAGE, (57) ABSTRACT, lines 4-5, change "an unsupported a seismic mass," to --an unsupported seismic mass,--

Column 1, line 42, change "to corresponding damage." to --in corresponding damage--

Column 2, lines 55, remove "is adapted to"

Column 2, line 61, remove "sensor" (1st occur)

Signed and Sealed this

Nineteenth Day of December, 2006

JON W. DUDAS
*Director of the United States Patent and Trademark Office*